United States Patent

Luz et al.

[11] 4,147,964
[45] Apr. 3, 1979

[54] COMPLEMENTARY LATCHING DISABLING CIRCUIT

[75] Inventors: David W. Luz; John C. Peer, both of Indianapolis, Ind.

[73] Assignee: RCA Corporation, New York, N.Y.

[21] Appl. No.: 876,228

[22] Filed: Feb. 9, 1978

[51] Int. Cl.² .............................................. H01J 29/70
[52] U.S. Cl. ...................................... 315/411; 358/243
[58] Field of Search ................ 315/411, 408; 358/190, 358/243

[56] References Cited

U.S. PATENT DOCUMENTS

| | | | |
|---|---|---|---|
| 3,931,567 | 1/1976 | Kostecki | 358/190 |
| 4,045,742 | 8/1977 | Meehan et al. | 328/9 |
| 4,074,323 | 2/1978 | Griffey | 358/243 |

Primary Examiner—Theodore M. Blum
Attorney, Agent, or Firm—Eugene M. Whitacre; Paul J. Rasmussen; Joseph Laks

[57] ABSTRACT

An oscillator responsive to a control signal generates a first signal at a first rate at an output terminal. A first transistor is coupled to the output terminal and to a load circuit. Normal operation of the load circuit depends upon the first transistor switching conductive states at the first rate. A second complementary type conductivity transistor forms a complementary disabling latch with the first transistor. A fault signal activates the latch and prevents the first transistor from switching conductive states, thereby disabling normal load circuit operation.

27 Claims, 9 Drawing Figures

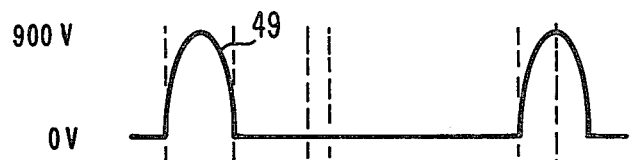
Fig.3a.
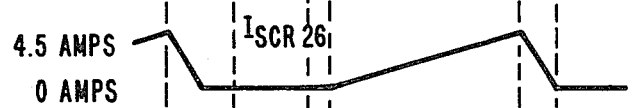
Fig.3b.
Fig.3c.
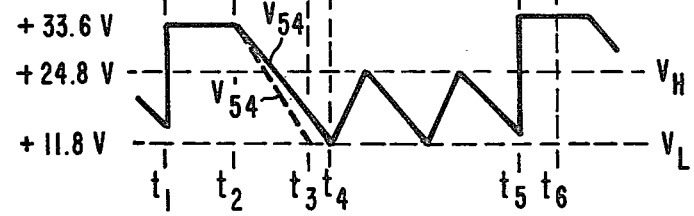
Fig.3d.
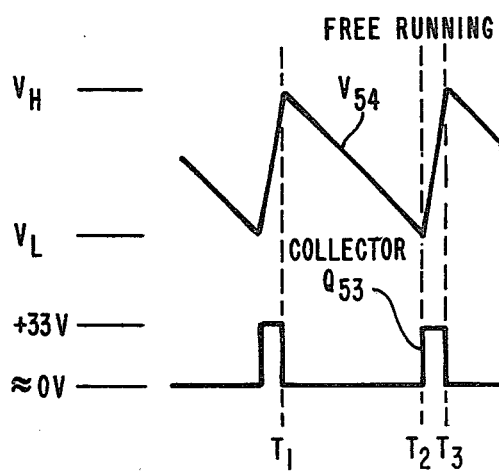
Fig.4a.
Fig.4b.
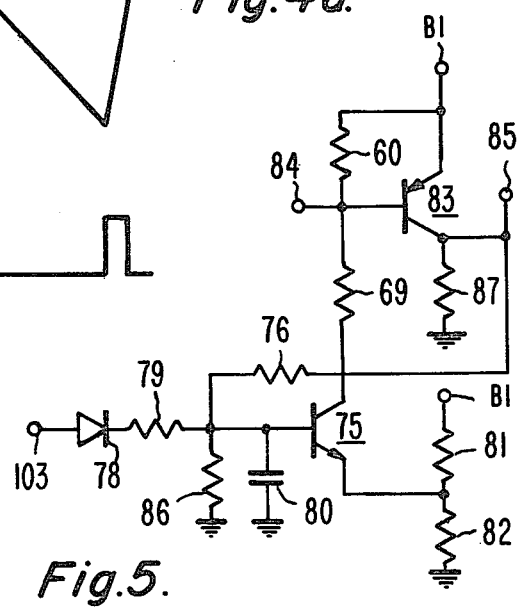
Fig.5.

COMPLEMENTARY LATCHING DISABLING CIRCUIT

BACKGROUND OF THE INVENTION

This invention relates to a latching disabling circuit useful in conjunction with an oscillator in a television receiver.

In many television receiver circuits, various oscillator circuits perform necessary functions for normal receiver operation. For example, the horizontal oscillator provides drive signals to an output switching device such as the horizontal output transistor. Should the oscillator be disabled, scanning will cease, and any supply voltages, such as the high voltage ultor supply voltage, will be removed. Similarly, many receivers provide B+ power supply regulation by conduction angle modulation of a controllable rectifier. An oscillator will typically provide switching signals to the controllable rectifier. If these signals are blocked, the B+ supply will be disabled.

For safety purposes, under various fault conditions, such as excess high voltage or current overload, disabling of the regulator or horizontal oscillator will disrupt normal television receiver operation or completely disable the receiver, removing the fault condition until circuit repairs are made. It is desirable to provide an oscillator disabling circuit that is readily adaptable for use with various oscillators, that involves a minimum of design modifications to existing circuits, and that uses a minimum of additional components.

SUMMARY OF THE INVENTION

An oscillator circuit with an input terminal responsive to control signals generates at an output terminal a first signal at a first rate. A first transistor is coupled to the output terminal and switches conductive states at the first rate. Normal operation of a load circuit coupled to the first transistor depends upon the first transistor switching conductive states at the first rate. The input and output terminals of a second transistor of a conductivity type, complementary to the first transistor, is coupled to the input and output terminals of the first transistor in a manner forming a complementary latch. A fault signal, coupled to a fault input terminal of the complementary latch, activates the latch and prevents the first transistor from switching conductive states, thereby disabling normal load circuit operation.

BRIEF DESCRIPTION OF THE DRAWING

FIGS. 3a–3d, 4a, and 4b illustrate waveforms associated with the circuits of FIGS. 1 and 2; and FIG. 5 illustrates an oscillator disabling circuit embodying the invention.

DESCRIPTION OF THE INVENTION

Figure 1:
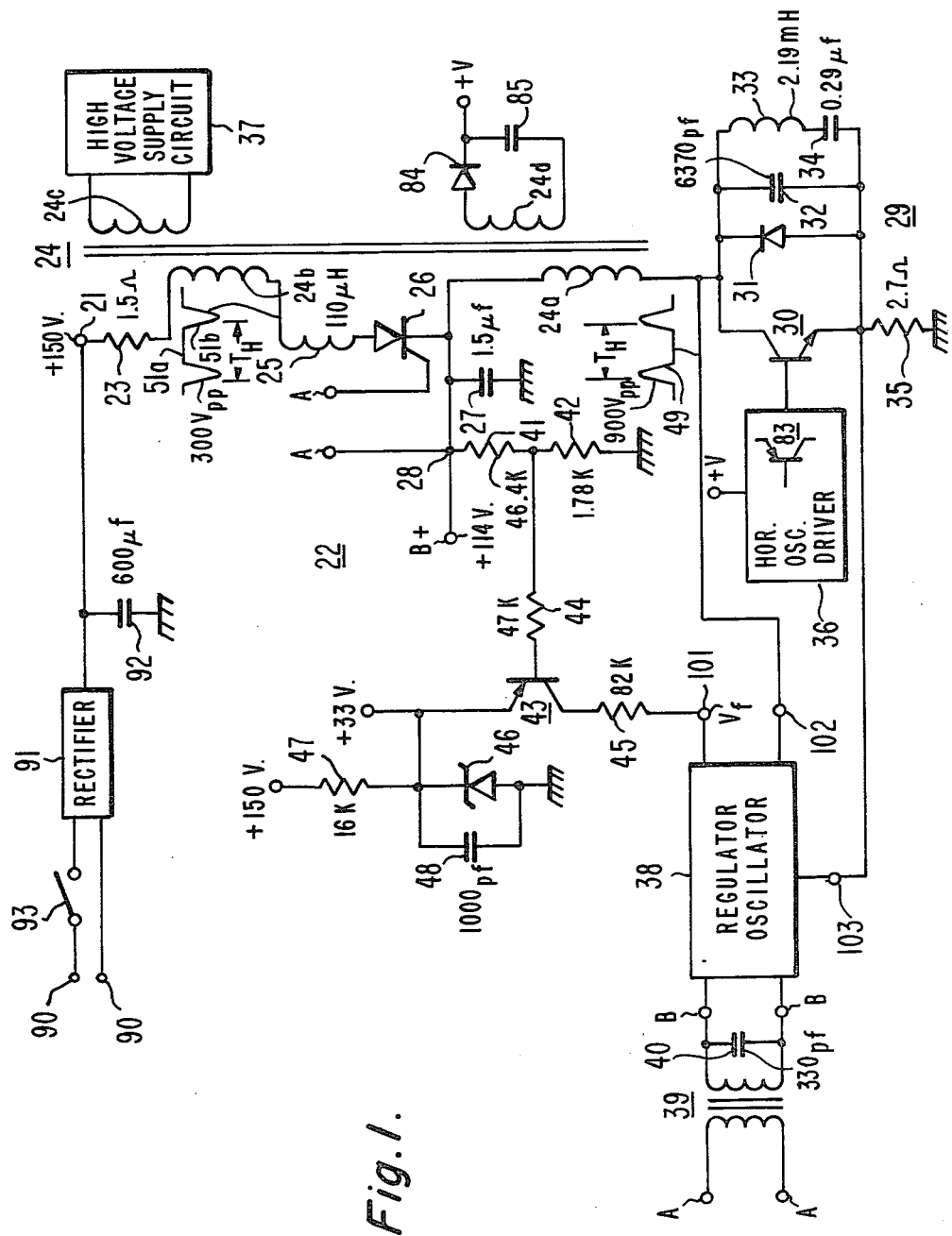
FIG. 1 illustrates a regulated deflection circuit embodying the invention.

A source of unregulated DC voltage illustratively +150VDC of FIG. 1, obtained, for example, by rectification through a rectifier 91 and filtered through a capacitor 92 of the AC line voltage at terminals 90, is coupled to a terminal 21 of a regulated horizontal deflection circuit 22. An on-off switch 93 is coupled to one of the terminals 20 for coupling and removing operative power to the receiver. The unregulated +150 volts is coupled through a series coupled resistor 23, secondary winding 24b of a horizontal output or flyback transformer 24, input inductor 25, regulator silicon controlled rectifier SCR 26, and a filter capacitor 27. A regulated B+ voltage illustratively of +114 volts DC is obtained at a terminal 28 at the cathode of SCR 26. Filter capacitor 27 may be coupled from terminal 28 to ground, as illustrated in FIG. 1, or may alternatively be coupled across terminals 21 and 28.

The +114 volt B+ voltage is coupled to a horizontal output stage 29 through a primary winding 24a of flyback transformer 24. Horizontal output stage 29 comprises a horizontal output switching transistor 30, damper diode 31, retrace capacitor 32, and series coupled horizontal deflection winding 33 and "S" shaping capacitor 34. The emitter of transistor 30 is coupled to ground through a current sensing resistor 35. Switching signals are coupled to transistor 30 from a scan-synchronized horizontal oscillator and driver 36. Ultor voltage for beam current is obtained for a high voltage supply circuit 37 coupled to a high voltage secondary winding 24c of flyback transformer 24. High voltage circuit 37 rectifies and/or multiplies the voltages developed across winding 24c during each deflection cycle. A low voltage, +V, for operating horizontal oscillator and driver 36, for example, may be obtained from a flyback secondary winding 24d by rectification by a diode 84 and filtering by a capacitor 85.

Regulator SCR 26 is gated into conduction each deflection cycle by a turn-on gating signal developed at terminals A—A and coupled to the gate and cathode of SCR 26. The gating signal is obtained from output terminals B—B of a regulator oscillator 38 and transformer coupled to terminals A—A by a transformer 39. A filter capacitor 40 is coupled across terminals B—B.

Regulation of the B+ voltage at terminal 28 against AC line and load variation is achieved by varying the conduction angle of SCR 26 within the deflection cycle. Voltage dividing resistors 41 and 42 are coupled to B+ terminal 28, and a feedback voltage at the junction of resistors 41 and 42 is coupled to an error amplifying transistor 43 through a resistor 44. The collector of transistor 43 is coupled to feedback terminal 101 through a resistor 45. Transistor 43 inverts and amplifies the feedback voltage and couples it to terminal 101 as a voltage $V_f$. The emitter of transistor 43 is maintained at a regulated voltage illustratively +33V by a zener diode 46. The cathode of zener diode 46 is coupled to the +150 volt unregulated source through a resistor 47. A filter capacitor 48 is coupled across zener diode 46. In response to feedback voltage $V_f$, regulator oscillator 38 varies the turn-on instant of the gating signals within the deflection cycle, thereby varying the SCR conduction angle, as will be further explained.

Regulator oscillator 38 is synchronized with horizontal deflection by coupling to a synchronizing input terminal 102 retrace pulses 49, illustrated in FIG. 3a, developed at the collector of output transistor 30. As illustrated in FIG. 3c, a turn-on gating pulse 50a at terminals A—A is developed by regulator oscillator 38 and gates SCR 26 into conduction at a controlled instant $t_4$ within each horizontal trace interval. Time $t_4$ is illustratively selected as a turn-on instant for relatively low line and heavy loading conditions. As illustrated in FIG. 3b, the current through input inductor 25 and SCR 26 linearly increases, with the voltage across inductor 25 being equal to the unregulated voltage at terminal 21 plus the positive trace voltage 51a developed across secondary winding 24b less the voltage developed at the B+ terminal 28. The current reaches a maximum near the end of trace, at time $t_5$. In response to the negative-going portion 51b of the voltage across winding 24b, the current in inductor 25 then begins to decrease in a resonant manner for commutating off SCR 26 at time $t_6$, as the negative retrace pulse 51b reverses the voltage polarity across input inductor 25. As illustrated in FIG. 3b, SCR 26 becomes nonconductive or is commutated off at time $t_6$ when the current through the SCR attempts to reverse direction.

Under certain fault conditions, SCR 26 may not be commutated off for several deflection cycles. For example, repetitive kinescope arcing may greatly diminish the negative retrace pulses 51b, thereby preventing SCR 26 from being commutated off and causing the B+ voltage to increase. The current through horizontal output transistor 30 of horizontal output stage 29 will greatly increase during the duration of such arcing to a stressful overload value. Such overload fault conditions are detected by coupling the voltage developed across current sensing resistor 35 to a fault input terminal 103 of regulator oscillator 38. Regulator oscillator 38 is disabled, thereby removing subsequent gating signals from output terminals B—B and preventing SCR 26 from being gated on during the fault condition after the several deflection cycles have elapsed. Other fault conditions involve failure of the beam current limiter to properly limit the ultor beam current and the drawing of the overload current from the flyback secondary supplies, such as the +V voltage supply.

Figure 2:
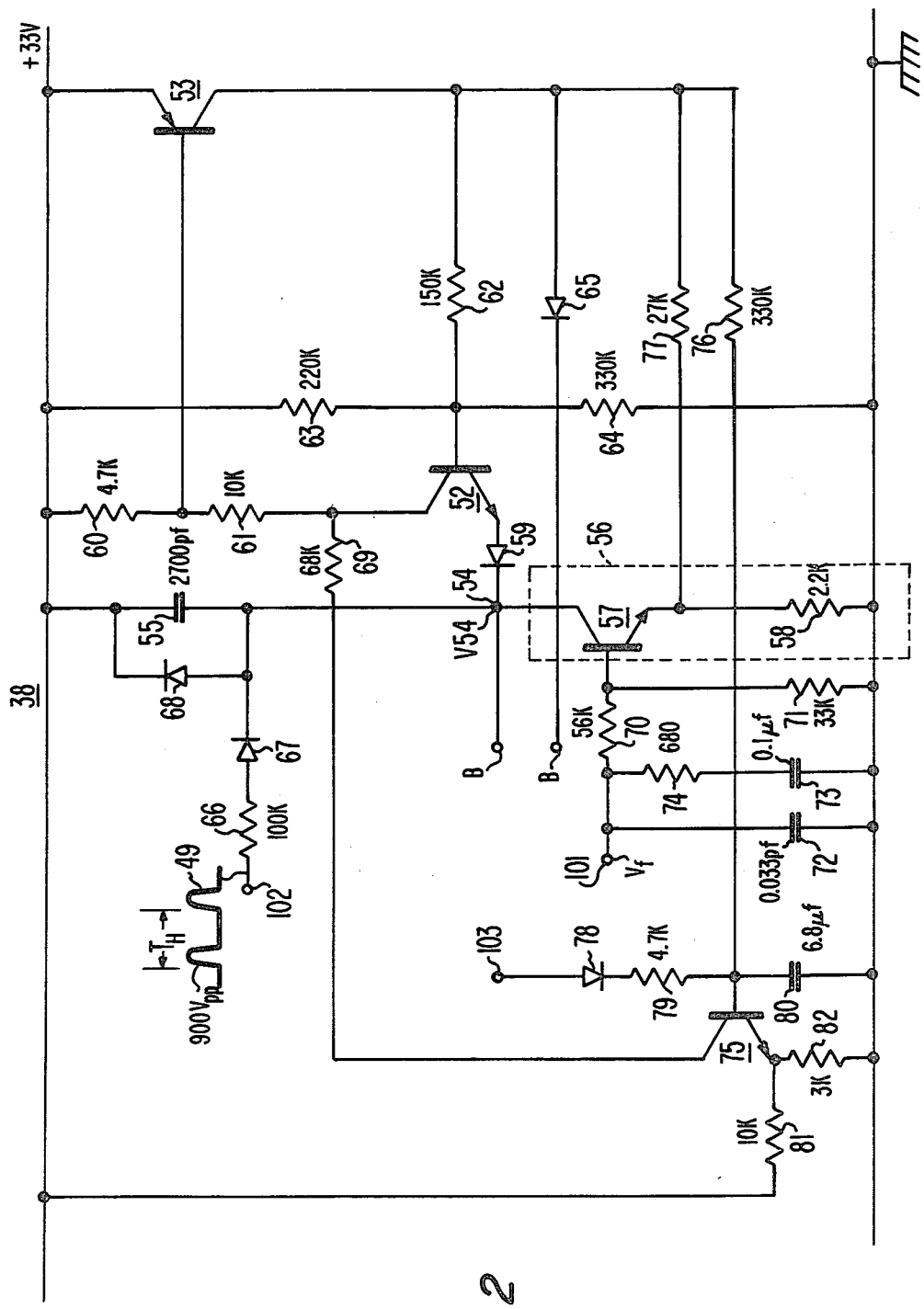
FIG. 2 illustrates an oscillator circuit embodying the invention.

FIG. 2 illustrates a regulator oscillator 38 embodying the invention, which oscillator may be substituted for the block 38 of FIG. 1. A PNP transistor 53 and a complementary type NPN transistor 52 switch conductive states at a rate established by trip level voltages for a control terminal 54 coupled to the emitter of transistor 52 through a diode 59. A charging capacitor 55 is coupled from the regulated +33 volt source to ground through an adjustable constant current source 56 comprising a transistor 57 and a resistor 58. The junction of capacitor 55 and the collector of transistor 57 comprises the control terminal 54.

The oscillator complementary transistors 52 and 53 are coupled together in a latching arrangement. That is, the collector output terminal of transistor 53 is coupled to the base input terminal of transistor 52, and the collector output terminal of transistor 52 is coupled to the base input terminal of transistor 53, both transistors thereby forming a regenerative latch. Thus, under free-running oscillator conditions, for example, when transistor 52 becomes conductive, current is drawn from the +33 volt source to the collector of transistor 52 through resistors 60 and 61, thereby turning on transistor 53. Part of the collector current of transistor 53 is then coupled to the base of transistor 52 through a resistor 62, thereby regeneratively turning on both transistors into saturated conduction. Similarly, when transistor 52 becomes nonconductive, both transistors regeneratively turn off.

Operation of regulator oscillator 38 for one free-running cycle will now be described. Consider an interval during which transistors 52 and 53 are nonconducting. The voltage at the base of transistor 52 is determined by the resistance values of a voltage divider comprising resistor 63 in series with the parallel combination of resistors 64 and 62. This base voltage establishes a two-diode drop less lower level trip voltage $V_L$ for control terminal 54. Should the voltage $V_{54}$ at terminal 54 decrease below the level $V_L$, transistors 52 and 53 would regeneratively turn on.

When transistors 52 and 53 are conductive, the voltage divider ratio changes. With transistor 53 in saturated conduction, resistor 63, rather than resistor 64, is now effectively paralleled by resistor 62, developing a new, more positive base voltage for transistor 52 and establishing a two-diode drop less upper level trip voltage $V_H$ for control terminal 54. Should the voltage $V_{54}$ at terminal 54 increase above the level $V_H$, transistors 52 and 53 would regeneratively turn off.

FIGS. 4a and 4b illustrate idealized waveforms for the voltage $V_{54}$ at control terminal 54 and the collector voltage of oscillator transistor 53. Consider the voltage $V_{54}$ during the interval, beginning somewhat after time $T_1$. Transistors 52 and 53 are turned off, and capacitor 55 is charging from the +33 volt source at a constant rate determined by the base voltage of transistor 57 of adjustable constant current source 56. The voltage at terminal 54 is thus a decreasing sawtooth. At time $T_2$, the voltage $V_{54}$ has decreased to its lower trip voltage level $V_L$. Transistors 52 and 53 regeneratively turn on.

Since the collector of transistor 53 is coupled to one of the output terminals B—B through a diode 65, capacitor 55 rapidly begins to discharge. The discharge path comprises the terminal of capacitor 55 coupled to the +33 volt source, the emitter-collector path of transistor 53, diode 65, the output load coupled across terminals B—B, and the other terminal of capacitor 55. To prevent constant current source 56 from undesirably charging capacitor 55 during the capacitor discharging interval, the collector of transistor 53 is coupled to the emitter of transistor 57 through a resistor 77. When transistor 53 conducts, transistor 57 is cut off, disabling current source 56 during the discharge interval.

As illustrated in FIG. 4a, beginning at time $T_2$, the voltage at terminal 54 comprises an increasing sawtooth. At time $T_3$, the voltage $V_{54}$ has increased to its upper trip voltage level $V_H$. Transistors 52 and 53 regeneratively turn-off, and the next charging cycle begins.

As represented by the collector voltage of transistor 53, illustrated in FIG. 4b, during the approximate interval $T_2-T_3$, an output signal is coupled to regulator oscillator 38 output terminals B—B to provide gating current to turn-on the regulator SCR 26 of FIG. 1. The actual time width of interval $T_2-T_3$ is relatively unimportant provided sufficient SCR gating current of a sufficient duration is coupled to SCR 26 to turn it on. The interval $T_2-T_3$ is a function of the time constant associated with the above-described discharge path and depends upon such factors as the transformed impedance at the primary side of transformer 39 and the leakage inductance of the transformer.

In actual operation for proper regulation, oscillator 38 is not left free-running but is synchronized with horizontal deflection. The charging rate of capacitor 55 is varied depending upon the magnitude of the feedback voltage $V_f$ coupled to feedback terminal 101 for varying the turn-on instant and conduction angle of SCR 26.

At the beginning of the retrace interval at time $t_1$ of FIG. 3a, a positive retrace pulse 49 illustratively is coupled from synchronizing terminal 102 through a resistor 66 and a diode 67 to control terminal 54. Capacitor 55 becomes substantially discharged. A diode 68 coupled in parallel with capacitor 55 conducts during the interval when its anode approximately exceeds the +33 volt supply voltage. Thus, as illustrated in FIG. 3d, the voltage $V_{54}$ at control terminal 54 during substantially all of retrace from times $t_1-t_2$ equals one diode drop greater than the +33 volt supply voltage, thereby synchronizing oscillator 38 with horizontal deflection.

After time $t_2$, the beginning of trace, capacitor 55 begins to charge at a rate determined by the voltage at the base of transistor 57 of adjustable constant current source 56. The voltage $V_{54}$ decreases until the lower trip voltage $V_L$ is reached at time $t_4$. At time $t_4$, oscillator transistors regeneratively turn on, resulting in a gating signal 50a being coupled to SCR 26 to turn the SCR on, as illustrated in FIG. 3c.

The oscillator then continues in a free-running mode and, as illustrated in FIG. 3d, several charge-discharge cycles may occur before another synchronizing retrace pulse 49 is coupled to terminal 101 at time $t_5$. Thus, as illustrated in FIG. 3c, in the subsequent free-running mode after time $t_4$, another SCR 26 gating signal 50b may be coupled to the SCR. The number of additional gating signals will depend upon such factors as the position of the turn-on instant $t_4$ within the horizontal trace interval and the charging and discharging rates established for capacitor 55. Such additional turn-on gating signals are of relatively little consequence, since the SCR remains in a conductive state as long as the current through the SCR is above its holding current level.

To provide regulation, the turn-on instant $t_4$ is varied within the trace interval by varying the charge rate of capacitor 55 through a varying voltage at the base of transistor 57. Transistor 57 base voltage is the proportioned value of the inverted and amplified feedback voltage $V_f$ coupled to the base of transistor 57 through a resistor 70 of a voltage divider comprising resistors 70 and 71. Filter elements 72-74 function to stabilize the oscillator operation against high frequency transients coupled to the base of transistor 57 and to provide phase compensation for any phase shifts occurring in the feedback loop.

Should the regulated B+ voltage at terminal 28 of FIG. 1 decrease, for example, the inverted feedback voltage increases causing the base voltage of transistor 57 to also increase. The current magnitude of constant current source 56 increases, increasing the charge rate of capacitor 55. As illustrated in FIGS. 3d and 3c by the dotted waveforms $V_{54}$ and 50c, the lower trip voltage level $V_L$ is reached at an earlier instant $t_3$, generating a gating pulse 50c at the earlier instant $t_3$, as required for proper regulation.

A main feature of the invention is to provide oscillator 38 with a disabling circuit to block the generation of SCR gating signals under overload or other fault conditions. With the SCR gating signals blocked, B+ operating voltage is removed from the output stage 29 of horizontal deflection circuit 22, disabling the high voltage and other supplies required for normal television receiver operation.

An NPN disabling transistor 75, a type complementary to the oscillator switching transistor 53, is coupled to transistor 53 in a manner forming a disabling latch for blocking SCR gating signals under fault conditions. The output collector of transistor 75 is coupled through resistors 69 and 61 to the input base of transistor 53, and the output collector of transistor 53 is coupled back to the input base of transistor 75 through a resistor 76. Transistor 53, which provides a necessary television receiver function, e.g., power supply regulator control under normal conditions, forms half of the disabling latch arrangement. Complementary disabling transistor 75 forms the other half of the latch.

Fault signals, such as developed across resistor 35 of FIG. 1 when an excess current flows through the horizontal output transistor, are coupled from fault input terminal 103 to the base of disabling transistor 75 through a diode 78 and a resistor 79. A capacitor 80 couples the base of transistor 75 to ground. The voltage at the emitter of transistor 75 equals a fraction of the +33 volt supply voltage, as determined by the values of voltage divider resistors 81 and 82 and establishes a threshold voltage for disabling normal television receiver operation.

When fault signals of sufficient duration and magnitude are coupled to terminal 103, transistor 75 turns on, activating the disabling latch and regeneratively turning on oscillator switching transistor 53. Transistors 53 and 75 will remain in a latched-on state and will remain conducting even though the fault signals are removed until, for example, the +33 volt supply is also removed, as by turning off the television receiver, which disables the AC line rectified and filtered +150 volt source. With transistor 53 conducting continuously in the latched-on state, capacitor 55 remains discharged, and transistor 57 remains cut off, thereby preventing any SCR gating signals from being formed. The horizontal deflection circuit and its associated power supplies are disabled, thereby protecting the component element from fault condition-induced failures.

By using a disabling latching arrangement, premature deactivation of the disabling circuit is prevented. As mentioned previously, the disabling latch, once activated, can only be deactivated by turning off the television receiver. The voltage across the filter capacitor 92 of FIG. 1 of the unregulated +150 volt source begins to decay, causing the dependent +33 volt supply to also decay. With diode 78 coupled to filter capacitor 80 of FIG. 2, the filter capacitor 80 effectively discharges only through the base-emitter of disabling transistor 75. Thus, the voltage decay across capacitor 80 follows closely the decay of the +33 volt supply.

After a predetermined interval, turning the receiver on restores relatively quickly the +150 volt source and the +33 volt supply, thus restoring also the emitter voltage of transistor 75 to its original value. The voltage at the base of transistor 75 does not increase but remains at the lower decayed value of capacitor 80. Transistor 75 turns off and deactivates the disabling latch. Normal regulator oscillator functioning is restored. Of course, should the fault condition be a persistent one, the disabling latch will again activate to again disable the receiver.

By using as half a disabling latch an existing oscillator switching transistor or a subsequent transistor stage driven by the oscillator, great flexibility is possible in designing the location of the disabling latch within the horizontal deflection circuit. Furthermore, only a single relatively inexpensive appropriate conductivity type transistor need be added to provide a disabling latching function to already existing circuits, thus requiring a relatively minimal amount of circuit redesigning.

For example, an appropriate complementary type disabling transistor may be coupled in a disabling latch arrangement to a transistor 83 of horizontal oscillator and driver 36. Transistor 83 is normally switched at a horizontal rate for coupling horizontal drive signals to output switching transistor 30. The switching of transistor 30 generates the trace and retrace voltages in the flyback transformer 24 secondary windings, which are rectified to produce various supply voltages. As illustrated in FIG. 5, when an appropriate fault signal, such as an excessively large retrace pulse or an excessive power supply voltage is coupled to the input terminal of disabling transistor 75, the disabling latch is energized and transistor 83 becomes latched continuously into one conductive state. In the latched condition, horizontal rate input signals at a terminal 84 no longer produce horizontal rate output signals at an output terminal 85. Normal oscillator and driver 36 switching is disabled as is normal switching of output transistor 30. The flyback generated supplies and normal television receiver operation are thereby also disabled until operative B1 voltage power to the latch is removed. A resistor 87 functions as a collector load for transistor 83. The values of resistors 81 and 82 are so proportioned that the normal average voltage at the collector of transistor 83 will not energize the disabling latch. A resistor 86, coupled across capacitor 80 divides the average transistor 83 collector voltage to a predetermined desired value and prevents the instantaneous and/or average collector voltage from activating the complementary disabling latch. Resistor 86 may be omitted if these collector voltages are sufficiently small.

What is claimed is:

1. A disabling circuit comprising: an oscillator circuit with an input terminal responsive to control signals for generating at an output terminal of said oscillator circuit a first signal at a first rate determined by said control signal;
    a first transistor coupled to said output terminal for switching conductive states at said first rate;
    a load circuit coupled to said first transistor, normal operation of said load circuit dependent upon said first transistor switching conductive states at said first rate;
    a second transistor of a conductivity type complementary to said first transistor, the appropriate output and input terminals of each of said first and second transistors coupled to one another in a manner forming a complementary latch; and
    an input fault terminal coupled to said complementary latch and responsive to a fault signal coupled to said input fault terminal for activating said complementary latch and preventing said first transistor from switching conductive states, thereby disabling normal operation of said load circuit.

2. A circuit according to claim 1, wherein said first transistor comprises a PNP type and said second transistor comprises an NPN type.

3. A circuit according to claim 2, wherein the collector of said first transistor is coupled to the base of said second transistor and the collector of said second transistor is coupled to the base of said first transistor for forming a regenerative path.

4. A circuit according to claim 1, wherein said load circuit comprises a controlled switching device for providing a regulated voltage at a device output terminal, a control terminal of said switching device coupled to said first transistor.

5. A circuit according to claim 4 including a deflection circuit coupled to said controlled switching device, said regulated voltage providing operative power to said deflection circuit.

6. A circuit according to claim 5, wherein said deflection circuit includes an output switching means for generating first and second intervals within a deflection cycle, said fault signal indicative of an excessive current flowing through said output switching means.

7. A circuit according to claim 6, wherein said output switching means comprises a switching transistor, and wherein a current sensing means is coupled to said switching transistor and said fault terminal is coupled to said current sensing means.

8. A circuit according to claim 7, wherein the collector of said first transistor is coupled to the base of said second transistor and the collector of said second transistor is coupled to the base of said first transistor for forming a regenerative path.

9. A circuit according to claim 1, wherein said load circuit comprises a horizontal output stage, said oscillator generating a first signal at a horizontal rate.

10. A circuit according to claim 9, wherein said first transistor is coupled to a horizontal output transistor of said horizontal output stage, activation of said complementary latch disabling said horizontal output transistor.

11. A circuit according to claim 10, wherein the collector of said first transistor is coupled to the base of said second transistor and the collector of said second transistor is coupled to the base of said first transistor for forming a regenerative path.

12. A circuit according to claim 1, including:
    a source of operative power for said complementary latch coupled to said complementary latch;
    biasing means coupled to said source of operative power and a bias terminal of said complementary latch for establishing a threshold level for activating said complementary latch; and
    filter means coupled to said input fault terminal for filtering said fault signal, the discharge of said filter means upon the disabling of said source of operative power after the activation of said complementary latch mainly occurring through said bias means providing for deactivating said complementary latch upon the re-enabling of said source of operative power prior to a complete removal of said operative power.

13. A circuit according to claim 12, wherein said filter means is coupled to one of the base and emitter of said second transistor and said biasing means is coupled to the other of said base and emitter.

14. A circuit according to claim 13 including unidirectional conducting means coupled between said input fault terminal and said filter means for preventing said filter means from discharging through said input fault terminal.

15. A circuit according to claim 14, wherein said oscillator includes a third transistor of conductivity type complementary to said first transistor coupled together in a regenerative manner, for maintaining said first and third transistors in identical conductive states when both are switching conductive states at said first rate.

16. A circuit according to claim 15 including capacitive charge-discharge means coupled to said input terminal for establishing said first rate.

17. A disabling circuit comprising:
    a source of unregulated voltage for supplying energy;
    a load circuit;
    controllable switching means coupled to said source and said load circuit for transmitting a controlled amount of energy from said source to said load circuit;

controllable oscillator means with an output terminal coupled to a control terminal of said controllable switching means and responsive to a feedback signal representative of an energy level of said load circuit for providing a switching signal at said output terminal to said controllable switching means for regulating said controlled amount of energy, said oscillator including a first transistor changing conductive states at a first rate;

a disabling transistor of a conductivity type complementary to that of said first transistor coupled to said first transistor in a manner forming a complementary latch; and fault signaling means coupled to an input terminal of said complementary latch and responsive to a fault condition within said load circuit for activating said complementary latch during the occurrence of said fault condition for maintaining said first transistor in a first conductive state when said complementary latch is activated for blocking said switching signal.

18. A circuit according to claim 17, wherein the collector of said first transistor is coupled to the base of said disabling transistor and the collector of said disabling transistor is coupled to the base of said first transistor for forming a regenerative path.

19. A circuit according to claim 17, wherein said load circuit comprises a deflection circuit including output switching means for generating first and second intervals within each deflection cycle.

20. A circuit according to claim 19, wherein said first rate comprises said deflection rate, an inductance in series with said controllable switching means having developed therein a deflection rate voltage, a first polarity of said deflection rate voltage commutating off said controllable switching means.

21. A circuit according to claim 20, wherein said fault signaling means comprises current sensing means coupled to said output switching means for sensing a fault condition wherein an excessive current flows through said output switching means.

22. A circuit according to claim 21, wherein the collector of said first transistor is coupled to the base of said disabling transistor and the collector of said disabling transistor is coupled to the base of said first transistor for forming a regenerative path.

23. A disabling circuit for a deflection circuit comprising:

a deflection circuit;

output switching means coupled to said deflection circuit for generating first and second deflection intervals;

a first transistor changing conductive states at a deflection rate in response to deflection rate signals coupled to an input terminal of said first transistor for providing a deflection rate switching signal at an output terminal of said first transistor;

means for coupling said deflection rate switching signal to said output switching means for generating said first and second deflection intervals;

a second transistor of a conductivity type complementary to that of said first transistor and coupled to said first transistor in an arrangement forming a complementary latch; and fault signaling means coupled to a fault input terminal of said complementary latch and responsive to a fault condition occurrence within said deflection circuit for energizing said complementary latch for disabling said output switching means by preventing said first transistor from changing conductive states.

24. A circuit according to claim 23, wherein the collector of said first transistor is coupled to the base of said second transistor and the collector of said second transistor is coupled to the base of said first transistor for forming a regenerative path.

25. A circuit according to claim 24, wherein said first transistor comprises a horizontal oscillator and said output switching means comprises a horizontal output transistor.

26. A circuit according to claim 25, wherein said deflection circuit includes a flyback transformer for generating an ultor voltage.

27. A circuit according to claim 26, wherein said fault signaling means comprises means for detecting retrace pulses developed in said flyback transformer.

* * * * *